United States Patent [19]

McDonough

[11] 4,266,433
[45] May 12, 1981

[54] LOW PROFILE PUSHBUTTON RADIO TUNER

[75] Inventor: Robert M. McDonough, Hatfield, Pa.

[73] Assignee: Ford Aerospace & Communications Corp., Detroit, Mich.

[21] Appl. No.: 960,884

[22] Filed: Nov. 15, 1978

[51] Int. Cl.³ .............................................. H03J 5/12
[52] U.S. Cl. ...................................... 74/10.33; 334/7
[58] Field of Search ................. 74/10.33, 10.37; 334/7

[56] References Cited

U.S. PATENT DOCUMENTS

| | | | |
|---|---|---|---|
| 3,863,509 | 2/1975 | Zimatore et al. | 74/10.33 |
| 3,946,344 | 3/1976 | Wilkinson | 334/7 |

FOREIGN PATENT DOCUMENTS 47-44281  11/1972  Japan ........................................... 334/7

Primary Examiner—Allan D. Herrmann
Attorney, Agent, or Firm—Paul K. Godwin, Jr.; Clifford L. Sadler

[57] ABSTRACT

The improvement to a low profile pushbutton radio tuner eliminates excessive friction between the mechanical parts thereof by providing loosely mounted cam followers in a mounting mechanism which provides for accurate centering and, therefore, accurate repetitive tuning of stations in response to depressed pushbuttons.

10 Claims, 4 Drawing Figures

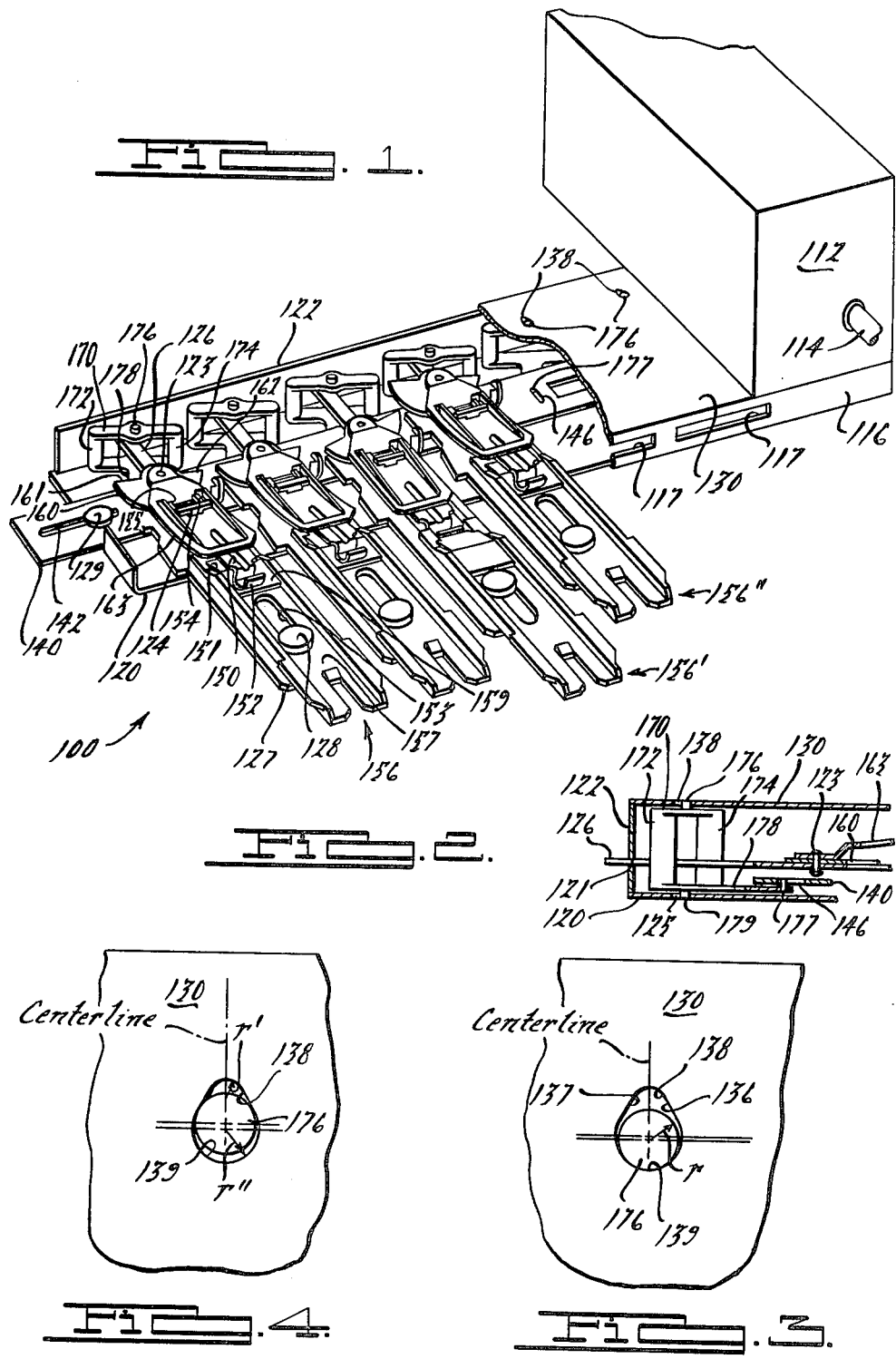

LOW PROFILE PUSHBUTTON RADIO TUNER

BACKGROUND OF THE INVENTION

1. Field of the Invention

The present invention relates to the field of pushbutton radio tuners and more specifically to obtaining improvements in repeatable tuning accuracy as well as decreasing frictional forces in the tuner assembly.

2. Description of the Prior Art

Over the past several years, many attempts have been made to reduce the size of conventional radio tuners, so that they will take up less space in vehicle dashboards and also achieve a beneficial weight reduction.

In U.S. Pat. No. 3,863,509, a relatively flat tuner design is shown, whereby reactance coils located in one end of the tuner are changed in position and tune stations, over a selected band, by movement of a flat bolt. The flat bolt is caused to translate in an arc generally orthogonal to the movement of pushbuttons mounted to slide in and out of the front of the chassis. Interaction between the pushbuttons and the flat bolt occurs due to cams mounted on the pushbuttons and cam follower devices mounted for rotation on the chassis. Several cam followers are mounted on the chassis and are each associated with a corresponding pushbutton. Therefore, when a pushbutton is depressed, the cam mounted thereon interacts with the corresponding cam follower and causes it to rotate about a pivot extending from the chassis. The other end of the cam follower has a pin which extends through apertures in the flat bolt and moves through an arc when the cam follower rotates to define the arcuate movement of the flat bolt. In this patent, several springs are used to take up slack in the linkage between the chassis, cam follower, and flat bolt. Consequently, sufficient friction is present between each pivotal connection to cause the mechanism to be tight and require high forces to be applied to the pushbuttons in order to effect tuning of the radio.

U.S. Pat. No. 3,946,344 is directed to a relatively flat radio tuning mechanism, whereby cam followers are mounted on pivots extending from the top of a chassis and are, in turn, pivot connected to a translating flat metal strip. The flat metal strip is movable along an arc to effect tuning of the radio. As in the previously discussed patent, each of the pin connections from the cam followers to the flat metal strip is spring biased. Each pivot connection of a cam follower to the top of the chassis is via a cylindrical stud extending from the cam follower through matching holes on the upper plate of the chassis. It is apparent that in order for tuning accuracy to be maintained in a repeatable manner, the holes in the top plate of the chassis must be machined to a close tolerance and thereby present some friction to rotation of the cam follower.

It can be seen from the two patents discussed above, that desirable accuracy in repeatable tuning is accompanied by the disadvantage of high resistance forces to tuning.

SUMMARY OF THE INVENTION

It is an object of the present invention to overcome the deficiencies found in the prior art by providing an accurately repeatable station tuning mechanism, which at the same time reduces frictional forces to pushbutton tuning.

The present invention is directed to a bearing configuration for mounting the cam followers with respect to the chassis. Frictional forces are removed from the tuning mechanism by allowing each of the cam followers to be loosely retained within the chassis. Accuracy of tuning is provided by an aligning mechanism within the bearing supports for the cam followers, whereby the depressed pushbutton causes the corresponding cam follower to move toward the rear of the chassis and to a centered position in the bearing support while being rotated to a setting corresponding to the preset cam on the depressed pushbutton. Connections between the cam followers and the tuning slide bar are also part of this invention, since they allow for smooth linear movement of the slide bar in response to arcuate movement of any single cam follower pin.

BRIEF DESCRIPTION OF THE DRAWINGS

FIG. 1 is a partial cut-away view of a low profile type radio tuner in which the present invention is embodied;

FIG. 2 is a partial cross-section showing a side view of the present invention;

FIG. 3 is a top view of a chassis aperture in which a cam follower is mounted for rotation, and wherein the corresponding pushbutton is in an undepressed position; and FIG. 4 illustrates the same aperture shown in FIG. 3 and the accurately centered position of the shaft of the cam follower when its corresponding pushbutton is in a depressed position.

DESCRIPTION OF THE PREFERRED EMBODIMENT

The following description is made with co-reference to FIGS. 1 and 2, wherein like elements are indicated with the same reference characters.

The present invention is embodied in a pushbutton tuner mechanism 100. A chassis is formed of a bottom plate 120, a back plate 122, a front plate 116, and a top plate 130. The front plate 116 has several rectangular apertures 117 along its length which allow for sliding movement of pushbutton keys therethrough. A sliding bar 140 has one end supported for longitudinal movement by a post 129. A longitudinal groove 142 in the sliding bar 140 surrounds the post 129 and provides linear directional guidance for the longitudinal movement of the bar 140. The opposite end of the bar 140 (not shown) has a like longitudinal groove which slides on a like post. That end of the bar 140 is connected to a conventional reactance tuning mechanism within housing 112, and is not shown, since it is not a part of the present invention. Similarly, a manual tuning shaft 114 is conventionally gear connected to reactance elements and also effects sliding motion of the bar 140, when stations are manually tuned.

A plurality of pushbutton assemblies are shown extending through apertures 117 in the front chassis plate 116. Since all of the pushbutton assemblies are identical, only the details of one designated as 156 are indicated in the figures. However, of the pushbutton assemblies indicated, they are shown in three different positions. Specifically, pushbutton assembly designated 156 is shown in a locked, relaxed position; pushbutton assembly designated 156' is shown in an unlocked, pulled position; and pushbutton assembly designated 156" is shown in a locked depressed position.

Pushbutton assembly 156 is made up of five separate elements. A support slide 127 supports each of the other four elements of the assembly and extends through a hole 121 in the rear chassis plate 122. Alignment is maintained for in and out movement of the support slide 127 via the aperture 121, in the rear plate 122, and the aperture 117, in the front plate 116. A spring (not shown) is used to bias the support slide 127 to the normal position shown for pushbutton assembly 156. A locking slide 157 is mounted on main support slide 127 for independent longitudinal sliding motion with respect to a post 128, which extends from support slide 127 through an aperture slot 153 in the locking slide 157. For pushbutton assembly 156, the locking slide 157 is shown in the locked position.

A tuning cam 160 is pivotally mounted on pin 123, which extends upward from support slide 127. The tuning cam 160 has cam faces 161 and 162, which are oriented transverse to the directional movement of the pushbutton assembly. A spring element 163 overlies the tuning cam 160 at pivot point 123.

A locking lever 150 is held in place by a "T" post 124, which extends from the support slide 127. The lever 150 has two legs 154 and 155 which extend around the base and under the arms of the "T" post 124. The legs 154 and 155 also extend over the upper surface of the tuning cam 160. The opposite end of the lever 150 has a cam follower surface 152, which rests on an elevated land 159 on the locking slide 157, when the pushbutton assembly is locked. The elongated spring 163 has a central elongated aperture, wherein one end thereof comes under legs 154 and 155 to provide an upward biasing force. The end of the spring 163, opposite the end surrounding pivot point 123, extends over the lever 150 to apply a continuous downward bias thereto.

The pushbutton assembly 156, in the normal locked position, shows that the cam follower surface 152 of the lever 150 is resting on the land 159. This configuration results in legs 154 and 155 being forced downward against the upper surface of the tuning cam 160 to lock it in an angularly oriented position, with respect to the pivot 123.

In order to unlock the pushbutton assembly 156, the locking slide 157 is pulled outward from the chassis as indicated in assembly 156' and allows the cam follower surface 152 to slide down a ramp 151 located adjacent to the land 159. When this occurs, the lever is forced down by the spring 163 and legs 154 and 155 are forced up to release the tuning cam 160. At that point, the tuning cam 160 is free to rotate about its pivot 123.

Lock up of the tuning cam 160 occurs when the locking slide 157 is fully depressed, such as shown in pushbutton assembly 156", thereby forcing the cam follower surface 152 of the lever 150 up the ramp 151 to the land 159.

During the depression step, but prior to lock up, the support slide 127 first becomes fully depressed and causes the tuning cam 160 to pivot about point 123, until both the cam surfaces 161 and 162 are in contact with a previously set cam follower 170. At that time, continued depression of locking slide 157 causes it to slide with respect to fully depressed support slide 127 and effect lock up of the lever 150 and tuning cam 160.

The cam follower 170 includes two follower posts 172 and 174 which are vertically oriented with respect to the horizontal orientation and movement of the pushbutton assembly 156. The surfaces of the follower posts 172 and 174 are cylindrical and have tangent components that are parallel to the cam surfaces 161 and 162 of the tuning cam 160. The cam follower 170 also includes coaxial shaft elements 176 and 179, which respectively extend into an elongated eccentric aperture 138 in the top chassis plate 130 and a like aperture 125 in the bottom chassis plate 120.

The cam follower 170 also includes a tongue portion 178 which extends under the slide bar 140 and contains a vertically oriented pin 177. The pin 177 extends upward through a slot 146 in the bar 140. The slots 146 extend along lines parallel to the direction of movement of each corresponding pushbutton assembly 156. The pins 177, of adjacent pairs of cam followers, are biased towards each other by an interconnecting coil spring (not shown). The biasing spring holds the respective pins 177 against the side of the corresponding slot 146 to effect a close tolerance connection between the cam followers and the bar 140, for accurate tuning.

Referring to FIGS. 2, 3 and 4, the eccentric apertures 138 are indicated. The apertures 138, in the top plate 130, correspond to coaxially aligned apertures 125 located in the bottom plate 120. Each of the apertures 138 (125) are generally triangular in shape and larger at the forward end 139 than the shaft 176 (179), which extends therein. This provides a free running fit for the shaft 176 and eliminates frictional components normally associated with cam follower mountings. When a pushbutton is depressed, such as that shown in 156", the associated cam follower 170 is forced towards the rear of the chassis and its corresponding shaft elements 176 and 179 are centered by inclined bearing wall surfaces 136 and 137, to guarantee accurate positioning of the cam follower and movement of the tuning bar 140. Such precise positioning provides for accurate repeatable station tuning.

The eccentric aperture 138 shown in FIGS. 3 and 4 are formed having a forward portion with a radius ($r''$), which is larger than the radius ($r$) of the shaft 176, and a rearward portion having a radius ($r'$), which is smaller than the radius ($r$) of the shaft 176. The inclined surfaces 136 and 137 join the front portion of the aperture 138 to the rear portion. The incline surfaces 136 and 137 are also symmetric about a center line which guarantees the rotational center of the shaft 176 to be located in a repeatable position each time a tuned station is set or a pushbutton is depressed to obtain the preset station thereof.

In order to illustrate the advantages of the present invention, a sequence of unlocking a pushbutton, manually setting a station, and then lock setting that station for repeat tuning by pushbutton, and pushbutton tuning is discussed below.

When it is desired to set a particular station (frequency) to be selectable by a particular pushbutton, two things must first occur. 1. The radio must be tuned to the particular desired frequency. This is usually accomplished by turning the manual tuning shaft 114 until the desired station is received. 2. The desired pushbutton must be unlocked. Pushbutton assembly 156' is shown in the unlocked condition, wherein the cam 160 is unlocked and freely pivots about post 123.

To achieve lock up of the unlocked pushbutton assembly and set the angular position of the cam 160 to match the cam follower angular position corresponding to the selected station, the pushbutton (not shown) attached to the external end of locking slide 157 is pushed towards the chassis. The entire slide assembly 156' will then longitudinally slide into the chassis until one of the cam surfaces 161 and 162 come in contact with respective cam surfaces 172 and 174. The cam 160 will then rotate about pivot 123' to assume the angular position of the cam follower 170. Further depression of the pushbutton causes the shaft elements 176 and 179 of only that corresponding cam follower to be centered in respective apertures 138 and 125 since these shaft elements are forced towards the rear of those apertures and centered by the inclined bearing surfaces 136 and 137. At that point, a counteracting force occurs between the manually forced locking slide 157 and the lever 150, which causes the ramp 151 to slide under camming surface 152 until the camming surface is on the land 159. The cam 160 is also locked by the legs 154 and 155 to conform with the position of the cam follower 170, in its rotationally centered position within the apertures 138 and 125. The pushbutton assembly 156″ is shown in the fully depressed position with the cam 160 fully locked. Upon release of the pushbutton, the pushbutton slide assembly returns to its normal position, as indicated by the pushbutton assembly 156. Thereafter, when it is desired to select a station corresponding to a particular pushbutton locked cam setting, the pushbutton is depressed, as indicated by pushbutton slide assembly 156″, and only that associated cam follower 170 rotates about the axis defined by shaft portions 176 and 179 and is forced to the rear of the corresponding apertures 138 and 125. At that point, the advantages of the improved cam follower mounting are realized. Each of the other cam followers, although ganged to the tuning bar 140 by respective pins 177, are free running with respect to the chassis and, therefore, are free to follow the movement of the tuning bar 140. These other cam followers do not present any significant drag that is communicated as resistance to the depressed pushbutton.

Similarly, the free rotational mounting of the cam followers 170 eliminates drag to the tuning bar 140 when the unit is tuned by the manual shaft 114.

Although the apertures 138 and 125 are shown herein to be rounded at opposite ends, it should be realized that the important details of those apertures are due to the cam followers being loosely retained within the chassis by the large opening at the forward end of the aperture, and due to the inclined bearing surfaces 137 and 138 being angled towards the rear of the chassis in order to provide a repeatable centering position for the cam follower.

It will be apparent that many modifications and variations may be effected without departing from the scope of the novel concept of this invention. Therefore, it is intended by the appended claims to cover all such modifications and variations which fall within the true spirit and scope of the invention.

I claim:

1. In a pushbutton radio tuner comprising:
   means for tuning selected radio frequencies;
   a chassis defining a front, back, top and bottom for said tuner;
   A shuttle bar connected to said tuning means for longitudinal movement to positions corresponding to said selected radio frequencies;
   a plurality of pushbutton assemblies mounted for sliding motion, through the front of said chassis, transverse to the movement of said shuttle bar;
   tuning cams having cam surfaces oriented transverse to both said sliding motion and said movement of said shuttle bar;
   means for pivotally mounting said tuning cams on respectively corresponding pushbutton assemblies;
   means on said pushbutton assemblies for locking said tuning cams in adjusted angular positions about their respective mounting means;
   means defining cam followers, associated with said pushbutton assemblies, having surfaces with tangents that lie in planes parallel to said tuning cam surfaces, and being supported by said chassis for rotational following movement about individual predetermined axes in response to engagement by said angularly locked cams and for translating said rotational following movement to said shuttle bar to effect its longitudinal movement;
   an improvement comprising:
   means in said chassis for accurately positioning only said engaged cam follower means for rotation about its predetermined axis, while simultaneously providing minimal friction bearing retention of others of said plurality of cam follower means.

2. An improved radio tuner as in claim 1, wherein said cam follower means rotates about an axis which is transverse to the motion of its associated pushbutton assembly and traverse to the movement of said shuttle bar, and said cam follower means includes coaxial shaft portions which extend through said positioning and bearing means.

3. An improved radio tuner as in claim 2, wherein said positioning and bearing means comprises generally elongated eccentric apertures in the top and bottom of said chassis, located so as to accept and retain said cam follower shaft portions for free rotation therein.

4. An improved radio tuner as in claim 3, wherein said elongated eccentric apertures each have a first end, which is wider than said shaft, a second end, which is narrower than said shaft, and bearing wall surfaces connecting said first and second ends.

5. An improved radio tuner as in claim 4, wherein said apertures are each symmetric about a center line that extends through its associated cam follower axis of rotation and parallel to the motion of its associated pushbutton assembly.

6. An improved radio tuner as in claim 5, wherein said shuttle bar includes elongated slots, which extend transverse to said longitudinal movement, and said cam follower means includes pins which respectively extend into corresponding slots on said shuttle bar for said translating.

7. An improved mount for cam followers in a pushbutton tuner comprising:
   a chassis having parallel opposing support plates for said cam followers, which each have coaxial shaft elements for rotational mounting and each cam follower is engageable by a corresponding depressable pushbutton;
   said improved mount includes eccentric apertures in at least one of said support plates wherein said apertures each have a first portion larger than said mounted shaft element to provide friction free rotation of said shaft element therein, and a second portion, smaller than said mounted shaft element, being joined to said first portion by inclined walls to provide a repeatable centered position for said mounted shaft only in response to engagement by a corresponding depressed pushbutton.

8. An improved mount as in claim 7, wherein said eccentric apertures are in both of said opposing support plates to provide said improved friction free rotation and centering for both said coaxial shaft elements on each cam follower.

9. An improved mount as in claim 8, wherein each said shaft element has a radius value and said first portions of said apertures have radius values greater than said shaft element radius values.

10. An improved mount as in claim 7, wherein said eccentric apertures are triangular shaped and said first portion encompasses a circular area within said aperture which is larger than that of said shaft element.

* * * * *